United States Patent [19]
Lin et al.

[11] Patent Number: 6,056,558
[45] Date of Patent: May 2, 2000

[54] ELECTRICAL CONNECTOR WITH IMPROVED TERMINALS FOR RECEIVING SOLDER BALLS

[75] Inventors: Nick Lin, Hsin-Chuang; Shih-Tsang Yang, Tai-Chung, both of Taiwan

[73] Assignee: Hon Hai Precision Ind. Co., Ltd., Taipei Hsein, Taiwan

[21] Appl. No.: 09/298,980

[22] Filed: Apr. 22, 1999

[30] Foreign Application Priority Data

Dec. 22, 1998 [TW] Taiwan .................................. 87221338

[51] Int. Cl.[7] ............................. H01R 4/02; H01R 12/04; H01R 12/32; H01R 1/00
[52] U.S. Cl. ............................................. 439/83; 439/876
[58] Field of Search ............................ 439/83, 874, 875, 439/876

[56] References Cited

U.S. PATENT DOCUMENTS

| | | | |
|---|---|---|---|
| 4,120,558 | 10/1978 | Seidler | 439/876 |
| 4,502,745 | 3/1985 | Chavers et al. | 439/876 X |
| 4,592,617 | 6/1986 | Seidler | 439/876 |
| 5,037,315 | 8/1991 | Collier et al. | 439/83 |

*Primary Examiner*—Stanley J. Witkowski
*Attorney, Agent, or Firm*—Wei Te Chung

[57] ABSTRACT

An electrical connector includes an insulative housing and a number of compound terminals for connecting a CPU to a circuit board. Each terminal has an arcuate engaging section whereby a solder ball can be easily positioned within the engaging section. Thus, assembly is expedited and proper signal transmission is ensured.

8 Claims, 5 Drawing Sheets

6,056,558

ELECTRICAL CONNECTOR WITH IMPROVED TERMINALS FOR RECEIVING SOLDER BALLS

BACKGROUND OF THE INVENTION

The present invention relates to an electrical connector, and particularly to an electrical connector having compound electrical terminals adapted for reliably accommodating solder balls.

As technology progresses, the functional requirements of electronic devices are becoming increasingly complicated, while the assembly process should be simplified. An electrical connector disclosed in U.S. Pat. No. 5,706,178 includes a plurality of solder balls mounted to terminals and connected to a circuit board. Referring to FIG. 1, a conventional electrical connector 1 includes an insulative housing 10 having a bottom surface 11. A plurality of conductive contacts 12 of the connector 1 are positioned in several rows of receiving cavities defined in the housing 10. Each solder ball 2 is positioned at a free end 13 of the corresponding conductive contact 12. When the connector 1 is correctly positioned on the circuit board, the solder balls 2 are heated and melted thereby attaching the connector 1 to the circuit board. However, the solder balls 2 are only engaged with a small portion of the free ends 13 of the contacts 12, thus the solder balls 2 may become easily detachable from the contacts 12. Upon heating, the solder ball 2 may not create an efficient electrical path with the proper contact 12 but may electrically engage with an adjacent contact 12 whereby adversely affecting signal transmission.

BRIEF SUMMARY OF THE INVENTION

A main object of the present invention is to provide an electrical connector with a plurality terminals defined with engaging sections, which have a large connection area for engaging with solder balls and ensuring reliable signal transmission.

Another object of the present invention is to provide an electrical connector having compound terminals each defining a receiving space whereby a solder ball can be accurately positioned therein.

To fulfill the above-mentioned objects, according to one embodiment of the present invention, an electrical connector comprises an insulative housing and a number of compound terminals. A top surface of the housing contacts a circuit board, and a bottom surface of the housing contacts a CPU. A number of passageways are defined in the insulative housing and the terminals extend through the corresponding passageways beyond the top and bottom surfaces of the housing to contact the CPU and the circuit board. An engaging section is positioned at an end of each terminal adjacent to the bottom surface of the housing. The engaging section defines a concave receiving space for reliably engaging with a solder ball.

Other objects, advantages and novel features of the invention will become more apparent from the following detailed description when taken in conjunction with the accompanying drawings.

DETAILED DESCRIPTION OF THE INVENTION

Figure 1:
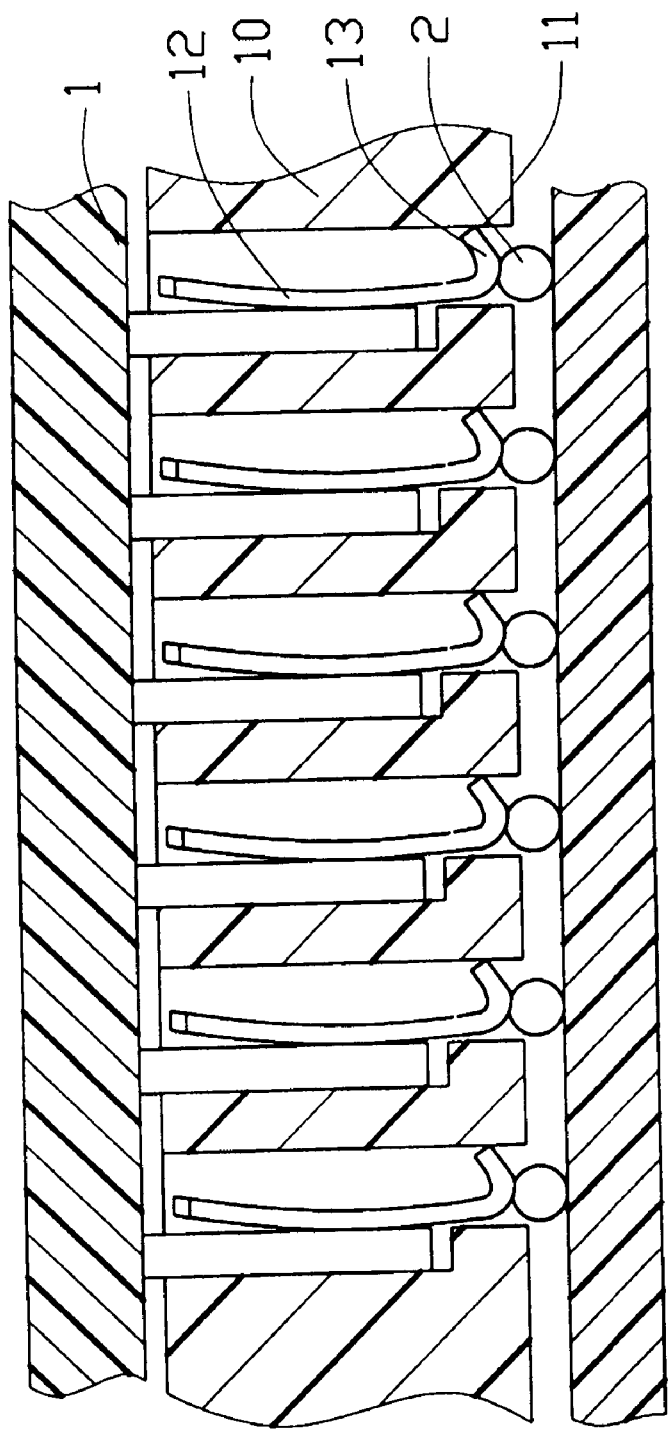
FIG. 1 is a cross-sectional view of a conventional electrical connector.
Figure 2:
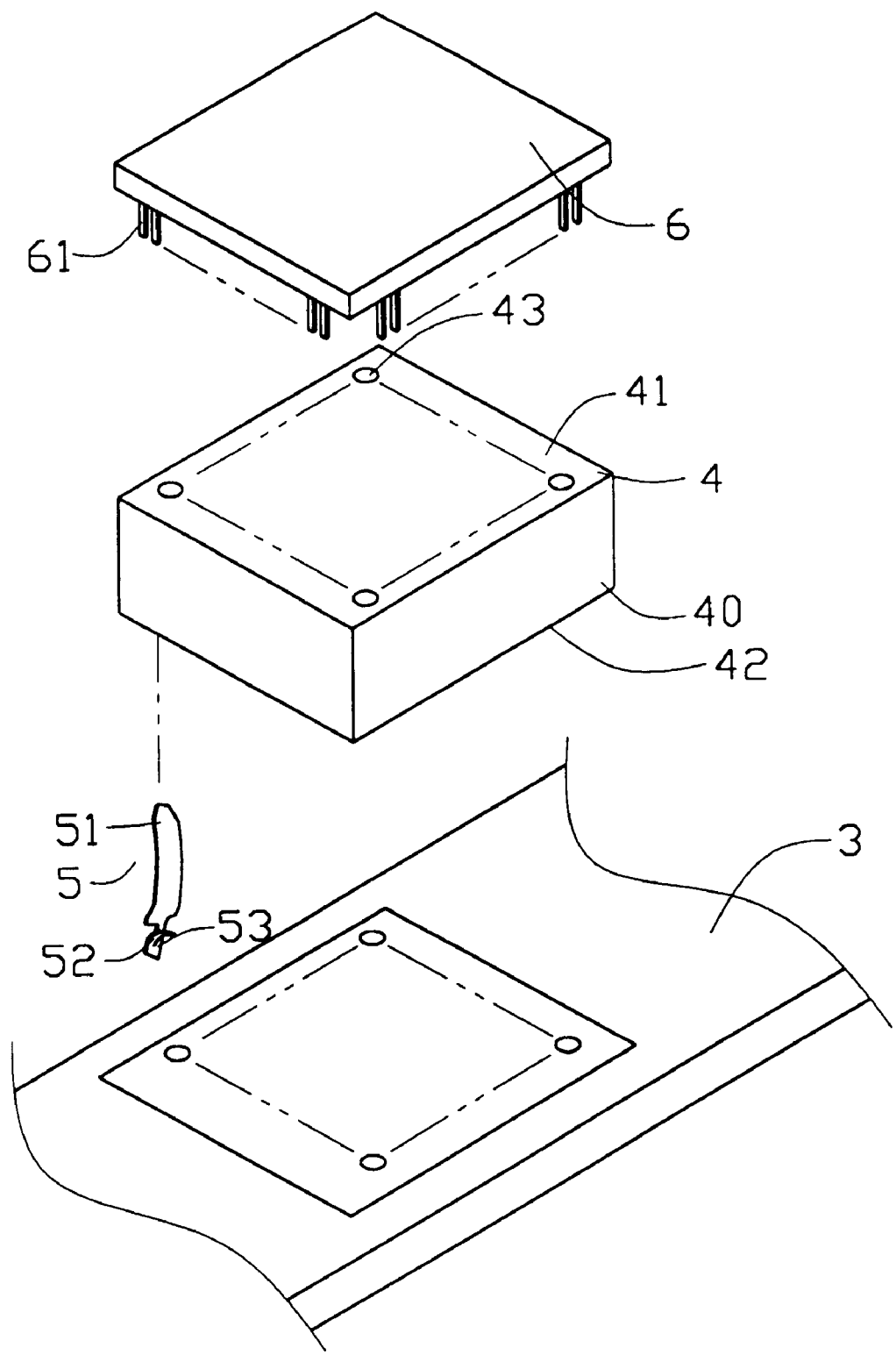
FIG. 2 is an exploded view of an electrical connector in accordance with the present invention.
Figure 3:
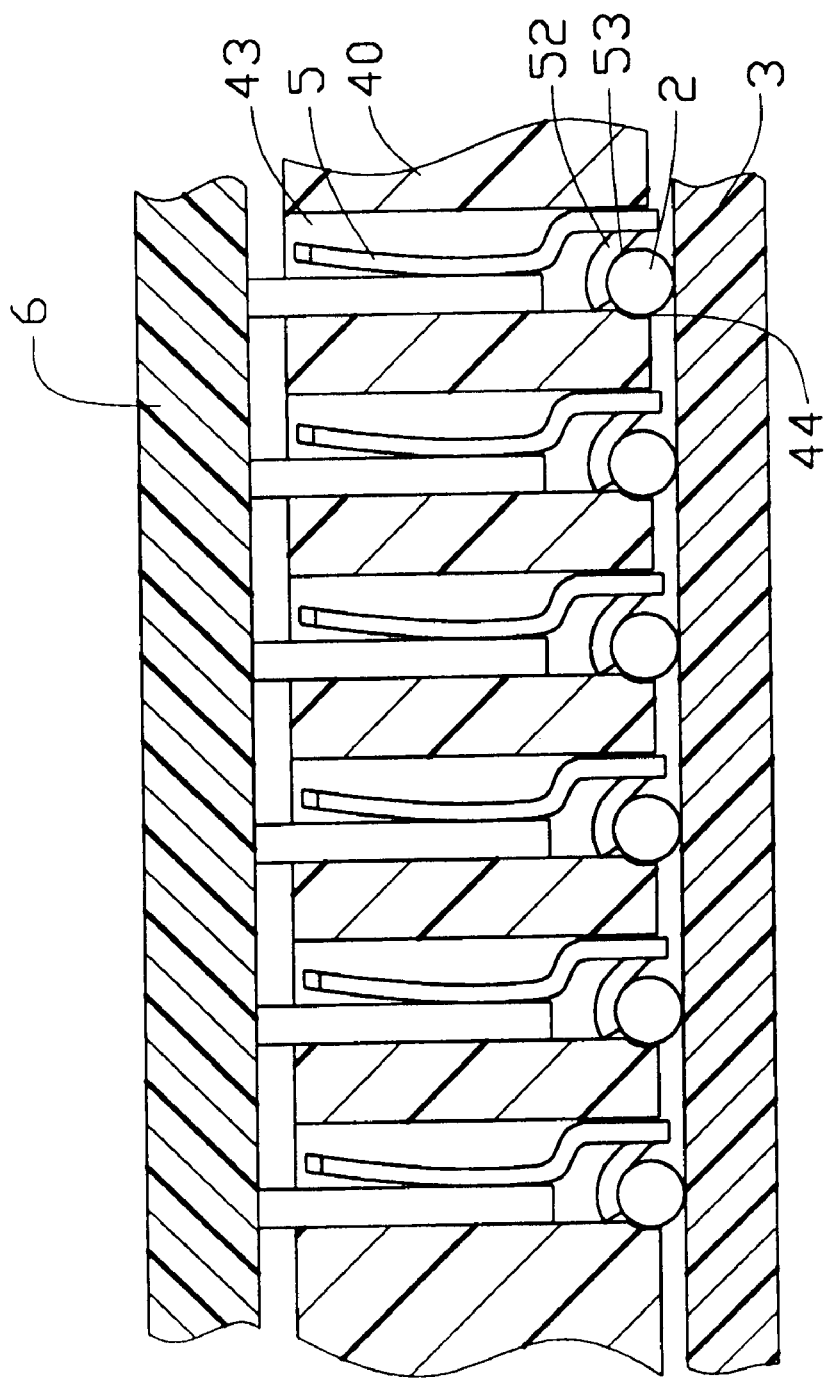
FIG. 3 is a cross-sectional view of the present electrical connector engaging with a CPU.
Figure 4:
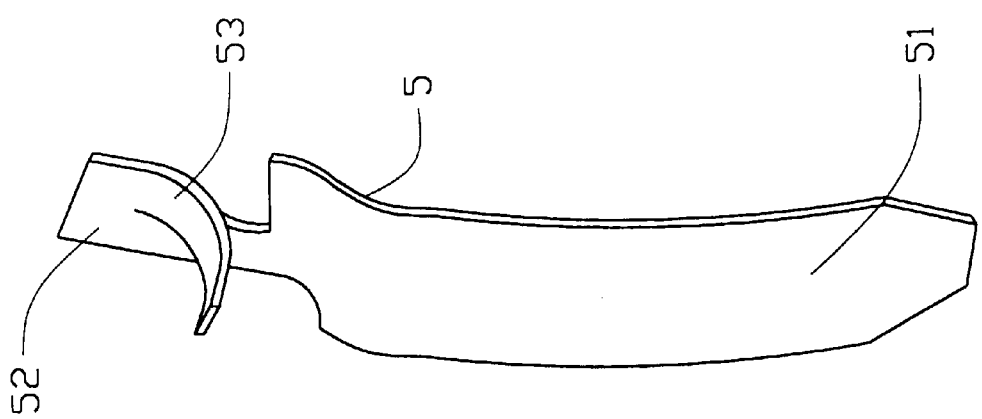
FIG. 4 is a perspective view of a compound terminal used with the connector of the present invention.

Referring to FIGS. 2 to 4, an electrical connector 4 comprises an insulative housing 40 and a plurality of compound terminals 5. The housing 40 has a top surface 41 for contacting a CPU 6 and a bottom surface 42 for connecting a circuit board 3. A plurality of passageways 43 is defined in the housing 40 for receiving the terminals 5 therein. Each passageway 43 has a concave surface 44 proximate the bottom surface 42 of the housing 40. Each terminal 5 forms a contacting section 51 at one end thereof for contacting a corresponding contact 61 of a CPU 6, and an engaging section 52 at an opposite end thereof for engaging with a solder ball 2. Furthermore, the engaging section 52 forms an arcuate projection 53 for facilitating engagement with the corresponding solder ball 2. When the solder balls 2 are melted, proper electrical contact is established between the connector 4 and the circuit board 3.

The arcuate projection 53 of the engaging section 52 and the concave surface 44 of the passageways 43 define a concave receiving space, thus the solder ball 2 is easily and firmly positioned therein. After the solder ball 2 is melted, the concavity of the receiving space facilitates retention of the molten solder within the corresponding passageway 43. Furthermore, the shape and resiliency of the arcuate projection 53 of the terminals 5 can be adjusted to fulfill elasticity requirements.

Figure 5:
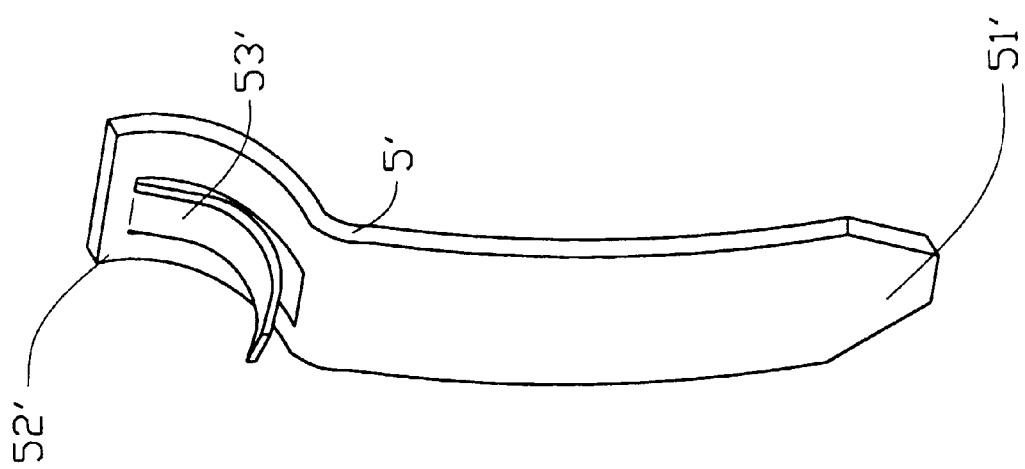
FIG. 5 is a perspective view of an alternative type terminal used with the present invention.

Referring to FIG. 5, an alternative type compound terminal 5' is shaped to have an arcuate plate 53' extending from a central portion of an engaging section 52' at one end thereof. The arcuate plate 53' defines a receiving space for facilitating engagement with a corresponding solder ball. A contacting foot 51' is formed at the other end for contacting a CPU.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical assembly comprising:
   an electrical connector comprising:
   an insulative housing defining a plurality of passageways between top and bottom surfaces thereof; and
   a plurality of terminals securely received in the passageways, each terminal having an engaging section at one end thereof near the bottom surface of the housing and a contacting section at the other end thereof near the top surface of the housing, the engaging section being curved with an arcuated space opened downwards;
   an electrical device disposed on the top surface of the housing and having a plurality of pins extending into the passageways to engage with the contacting sections of the plurality of terminals;
   a circuit board disposed under the bottom surface of the housing; and a plurality of solder balls being sandwiched between the engaging section of each terminal and the circuit board, said solder balls each having a portion received in the arcuated space of the engaging section.

2. The electrical assembly as claimed in claim 1, wherein the engaging section of the terminal has an arcuate projection forming the arcuated space.

3. The electrical assembly as claimed in claim 1, wherein the passageways of the insulative housing each have a concave surface proximate the bottom surface for facilitating the reception of the solder balls in the curved engaging sections of the terminals.

4. The electrical assembly as claimed in claim 1, wherein the engaging section of the terminal comprises a resilient plate which is bifurcated and forms the arcuated space.

5. An electrical connector comprising:

an insulative housing defining plurality of passageways between top and bottom surfaces thereof; and a plurality of terminals securely received within the passageways, respectively, each of said terminals having an engaging section around the top surface and a contact section around the bottom surface, wherein said contact section defines a downward arcuate projection split therefrom to receive a solder ball therein, and most of said solder ball essentially is embedded within the corresponding passageway above said bottom surface.

6. An electrical assembly comprising:

an electrical connector comprising:

an insulative housing defining a plurality of passageways between top and bottom surfaces thereof, each passageway having a concave surface proximate the bottom surface; and a plurality of terminals securely received in the passageways, each terminal having an engaging section at one end thereof near the bottom surface of the housing and a contacting section at the other end thereof near the top surface of the housing, the engaging section being curved with an arcuated space opened downwards;

an electrical device disposed on the top surface of the housing and having a plurality of pins extending into the passageways to engage with the contacting sections of the plurality of terminals;

a circuit board disposed under the bottom surface of the housing; and a plurality of solder balls being sandwiched between the engaging section of each terminal and the circuit board, said solder balls each having a portion received in a corresponding arcuated space of the engaging section and a corresponding concave surface.

7. The electrical assembly as claimed in claim 6, wherein the engaging section of the terminal comprises a resilient plate which is bifurcated and forms the arcuated space.

8. The electrical assembly as claimed in claim 6, wherein the engaging section of the terminal has an arcuate projection forming the arcuated space.

* * * * *